US008324916B2

(12) United States Patent
Hayashi

(10) Patent No.: US 8,324,916 B2
(45) **Date of Patent: *Dec. 4, 2012**

(54) ELECTRO-OPTICAL DEVICE

(75) Inventor: Takaaki Hayashi, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/172,351

(22) Filed: Jun. 29, 2011

(65) Prior Publication Data

US 2011/0254555 A1 Oct. 20, 2011

Related U.S. Application Data

(63) Continuation of application No. 11/352,361, filed on Feb. 13, 2006, now Pat. No. 7,994,810.

(30) Foreign Application Priority Data

Feb. 14, 2005 (JP) ................................ 2005-035643
Feb. 14, 2005 (JP) ................................ 2005-035644
Feb. 14, 2005 (JP) ................................ 2005-035645
Dec. 28, 2005 (JP) ................................ 2005-377150

(51) Int. Cl.
*G01R 31/00* (2006.01)
*G01R 31/26* (2006.01)

(52) U.S. Cl. ............ 324/750.3; 324/760.01; 324/762.01

(58) Field of Classification Search ........................ None
See application file for complete search history.

(56) References Cited

U.S. PATENT DOCUMENTS 6,483,493 B2 11/2002 Murade
6,784,862 B2 8/2004 Kodate et al.

(Continued)

FOREIGN PATENT DOCUMENTS

JP A-1-130132 5/1989

(Continued)

OTHER PUBLICATIONS

Dec. 14, 2010 Office Action issued in corresponding Japanese Application No. 2009-032309 (with English-language translation).

(Continued)

*Primary Examiner* — Vinh Nguyen
(74) *Attorney, Agent, or Firm* — Oliff & Berridge, PLC

(57) ABSTRACT

An electro-optical device includes a substrate, a plurality of unit circuits that includes a plurality of scanning lines, a plurality of data lines and electro-optical elements provided corresponding to intersecting regions of the scanning lines and the data lines and is formed in a display region of the substrate, a plurality of pixel circuits that includes electro-optical elements and is formed in the display region and a sealing member that seals the electro-optical elements of the plurality of pixel circuits formed in the display region and is attached to the substrate, wherein a test circuit is formed between an attaching region at which the sealing member is attach to the substrate and the display region.

7 Claims, 6 Drawing Sheets

U.S. PATENT DOCUMENTS

| | | | | |
|---|---|---|---|---|
| 6,788,278 | B2 * | 9/2004 | Aoki | 345/82 |
| 6,867,761 | B2 * | 3/2005 | Matsueda | 345/100 |
| 6,876,000 | B2 | 4/2005 | Nakanishi | |
| 7,187,006 | B2 | 3/2007 | Hayashi | |
| 7,348,207 | B2 * | 3/2008 | Kobayashi | 438/99 |
| 7,649,585 | B2 * | 1/2010 | Jeoung et al. | 349/54 |
| 7,994,810 | B2 * | 8/2011 | Hayashi | 324/760.01 |
| 2004/0184131 | A1 * | 9/2004 | Kurashina | 359/245 |
| 2006/0223221 | A1 * | 10/2006 | Ishii | 438/99 |
| 2007/0122928 | A1 | 5/2007 | Hayashi | |
| 2009/0213054 | A1 * | 8/2009 | Masui | 345/88 |

FOREIGN PATENT DOCUMENTS

| | | |
|---|---|---|
| JP | A-7-248479 | 9/1995 |
| JP | A-10-214065 | 8/1998 |
| JP | A-2001-265248 | 9/2001 |
| JP | A-2003-307739 | 10/2003 |
| JP | A-2004-4993 | 1/2004 |
| JP | A-2004-200034 | 7/2004 |
| JP | A-2004-310053 | 11/2004 |
| KR | 10-2004-0054492 A | 6/2004 |

OTHER PUBLICATIONS

Oct. 28, 2010 Office Action issued in U.S. Appl. No. 11/352,361.

* cited by examiner

ELECTRO-OPTICAL DEVICE

CROSS-REFERENCE TO RELATED APPLICATIONS

This is a Continuation of application Ser. No. 11/352,361 filed Feb. 13, 2006, now U.S. Pat. No. 7,994,810, which in turn claims priority to Japanese Application Nos. 2005-035643 filed on Feb. 14, 2005, 2005-035644 filed on Feb. 14, 2005, 2005-035645 filed on Feb. 14, 2005, and 2005-377150 filed on Dec. 28, 2005, which are hereby expressly incorporated by reference herein in their entirety.

BACKGROUND

The present invention relates to an electro-optical device.

Recently, in an electro-optical device such as an organic electroluminescent display, as a display image is high-defined and the size of screen is increased, the increase of pixel circuits and the miniaturization of a wiring pattern or an electrode pattern have been required.

Therefore, in each of the processes of manufacturing an organic electroluminescent display (an organic EL display), a complicated and advanced technique is required. Simultaneously, it has been important that various types of test (for example, full light test) are performed to secure the performance and reliability of these organic EL displays before shipment of the organic EL displays in each of the manufacturing processes.

Moreover, a test circuit for performing the various types of test is provided on a substrate along with a plurality of pixel circuits (for example, JP-A-2004-200034, JP-A-10-214065).

In JP-A-2004-200034, a sealing member for protecting an electro-optical element on a substrate is attached to overlap a test circuit that an attachment portion of the sealing member is formed on the substrate, whereby miniaturization of device can be achieved.

Moreover, in JP-A-10-214065, a transistor element constituting a test circuit is disposed in a sealing region (a region that a sealing member is attached to a substrate), whereby the sealing region, so-called a debt space, can be effectively used.

However, since both the test circuits are formed at the portions overlapping with a sealing member, the protection by a sealing member has not been able to be enjoyed sufficiently.

Moreover, since both the test circuits face off against the attaching surface of a sealing member, when any force is applied to the sealing member, there has been a problem that the test circuits are deteriorated because the force is directly applied to the test circuits.

SUMMARY

An advantage of some aspects of the invention is that it provides an electro-optical device which is capable of protecting a test circuit formed on a substrate from peripheral environment.

According to an aspect of the invention, there is provided an electro-optical device including a substrate, a plurality of unit circuits that includes a plurality of scanning lines, a plurality of data lines and electro-optical elements provided corresponding to intersecting regions of the scanning lines and the data lines and is formed in a display region of the substrate, a plurality of pixel circuits that includes electro-optical elements and is formed in the display region and a sealing member that seals the electro-optical elements of the plurality of pixel circuits formed in the display region and is attached to the substrate, wherein a test circuit is formed between an attaching region at which the sealing member is attached to the substrate and the display region.

The electro-optical device according to the aspect of the invention, since a test circuit formed on a substrate is entirely included in a sealing member, the test circuit is protected from moisture in the air, oxygen and the like.

Moreover, since the test circuit is directly formed between a display region faced off against an attaching surface of a sealing member and an attaching region, a force applied to the sealing member, for example, a force attaching the sealing member to the substrate when the sealing member is attached to the substrate, is not directly applied to through the attaching surface. Accordingly, there is a little problem that the test circuit is deteriorated due to the force applied to a sealing member by any cause.

In addition, for example, if a sealing member is made of metallic member such as stainless and the like, since an electrical noise from the outside is completely cut off by the sealing member, a test circuit does not malfunction due to an electrical noise.

In the invention, it is preferable that the test circuit includes at least one of: a test circuit part for data line control that supplies a test data signal to each of the plurality of data lines; and a test circuit part for scanning line control that selectively supplies a selection signal for test to each of the plurality of scanning lines.

According to the electro-optical device, in the electro-optical device including a test circuit part for data line control and a test circuit part for scanning line control, the test circuit part is protected from peripheral environment (moisture, oxygen, external force and the like)

Further, in the invention, it is preferable that the test circuit part for data line control includes a test mode signal supply line that supplies a test mode signal, a test data signal supply line that supplies a test data signal and a transistor that is provided between the test data signal supply line and each of the plurality of data lines, thereby supplying the test data signal to the corresponding data line base on the test mode signal, respectively.

According to the electro-optical device, since the test circuit part for data line control is formed by minimal circuit configuration constituted by a test mode signal supply line, a test data signal supply line and a transistor, the same test circuit part can be formed between a display region and an attaching region.

Furthermore, in the invention, it is preferable that the test mode signal supply line and the test data signal supply line are electrically connected to an external terminal for test formed at any one of four corners of the substrate, respectively.

According to the electro-optical device, since the external terminal for test is formed at corners of the substrate deviated from an external terminal of a data line formed on a side of a substrate which is an extension of each data line, the size of the substrate is not increased, and at the same time, the size of the external terminal can be increased.

Furthermore, according to the electro-optical device, the test for testing a various color type electro-optical element can be performed.

Furthermore, in the invention, it is preferable that the test circuit part for scanning line control includes a selection signal supply line that supplies a selection signal for test, a clock signal supply line that supplies a clock signal for test, a test mode signal supply line that supplies a test mode signal, a shift register that is provided corresponding to each of the plurality of data lines, and shifts the selection signal from one side to the other side in response to the clock signal and then outputs the selection signal to the corresponding scanning line and a transistor that supplies the selection signal to the scanning line based on the test mode signal.

According to the electro-optical device, since the test circuit part for scanning line control is formed by minimal circuit configuration constituted by a selection signal supply line, a clock signal supply line, a test mode signal supply line and a shift transistor and a transistor, the same test circuit part can be formed between a display region and an attaching region.

Furthermore, in the invention, it is preferable that the selection signal supply line, the clock signal supply line and the test mode signal supply line are electrically connected to an external terminal formed at any one of four corners of the substrate, respectively.

According to the electro-optical device, since the external terminals for test of the selection signal supply line, the clock signal supply line and the test mode signal supply line are formed at corners of the substrate deviated from an external terminal of a scanning line formed on a side of the substrate which is an extension of each scanning line, the size of the substrate is not increased, and at the same time, the size of the external terminal can be increased.

According to another aspect of the invention, there is provided an electro-optical device including a substrate, a plurality of unit circuits that includes a plurality of scanning lines supplied with a selection signal, respectively, a plurality of data lines supplied with a data signal, respectively and electro-optical elements provided corresponding to intersecting regions of the scanning lines and the data lines and is formed in a display region of the substrate, a test circuit that is formed in a location adjacent to the display region and a sealing member that seals a plurality of unit circuits formed in the display region and is attached to the substrate, wherein an external terminal for test for the test circuits is formed at corner of the substrate located outside an attaching region in which the sealing member is attached to the substrate.

The electro-optical device according to the aspect of the invention, the external terminal for test is formed at corner of the substrate deviated from a side of the substrate which is an extension of each scanning line and each data line. As a result, the size of the substrate is not increased, and at the same time, the size of the external terminal can be increased.

Moreover, since the external terminal for test is formed outside an attaching region, even after a sealing member is attached, test can be performed.

In the invention, there is provided an electro-optical device including: a plurality of selection signal input terminals that is electrically connected to each of the plurality of scanning lines and is supplied with the selection signal; and a plurality of data signal input terminals that is electrically connected to each of the plurality of data lines and is supplied with the data signal, wherein the plurality of selection signal input terminals is provided on a first side of the substrate, the plurality of data signal input terminals is provided on a second side of the substrate different from the first side of the substrate, and the external terminal for test is formed at corner portions where the first side and the second side are intersected.

According to the electro-optical device, the selection signal input terminals provided on a first side of the substrate and the data signal input terminals provided on a second side of the substrate are not formed at corner portions where the first side and the second side are intersected. As a result, the size of the substrate is not increased, and at the same time, the size of the external terminal can be increased.

According to a further aspect of the invention, there is provided an electro-optical device including a substrate, a plurality of unit circuits that includes a plurality of scanning lines supplied with a selection signal, respectively, a plurality of data lines supplied with a data signal, respectively and electro-optical elements provided corresponding to intersecting regions of the scanning lines and the data lines and is formed in a display region of the substrate and a test circuit that is formed in a location adjacent to the display region, wherein an attaching region that attaches a sealing member for sealing a plurality of unit circuits formed in the display region to the substrate is formed, and a plurality of external terminals for test for the test circuit used with an alignment mark is formed outside the attaching region.

The electro-optical device according to the aspect of the invention, when an external terminal for test is formed on a substrate, since the external terminal for test can be used as an alignment mark, it can be used for alignment work in the process of manufacturing a plurality of electro-optical elements. Further, since the external terminal for test is formed outside an attaching region by a sealing member, it can be also used for alignment work when a sealing member is attached to a substrate.

In the invention, it is preferable that the plurality of external terminals for test is formed at a corner of the substrate.

According to the electro-optical device, since the plurality of external terminals for test is formed at a corner of the substrate, the size as an external terminal can be increased. Further, since the plurality of external terminals is easily connected with a probe and the size as an alignment mark becomes increased, the alignment work with high precision is easily performed.

In the invention, it is preferable that the plurality of external terminals for test is formed at each of the corner of the substrate, and is disposed and formed along a side of each of the corners.

According to the electro-optical device, since the plurality of external terminals for test is disposed and formed along a side of the corner, the alignment work with high precision can be performed in the relation of the disposition of the plurality of external terminals for test.

Further, according to the electro-optical device, the test for testing a various color type electro-optical element can be performed, and the external terminal for test can be used as an alignment mark in the process of manufacturing an electro-optical element.

In the invention, it is preferable that the electro-optical element is an electroluminescent element.

According to the electro-optical device, the test of an electroluminescent element can be performed, and the external terminal for test can be used as an alignment mark in the process of manufacturing an electroluminescent element.

Further, according to the electro-optical device, the test of an electroluminescent element can be performed, and the external terminal for test can be used as an alignment mark in the process of manufacturing an electroluminescent element, for example, manufacturing the same by using a droplet discharging apparatus.

In the invention, preferably, there is provided an electro-optical device in which a plurality of electro-optical elements outgoing red light, a plurality of electro-optical elements outgoing green light and a plurality of electro-optical elements outgoing blue light are formed. The signal supply line of the test circuit includes a test data signal for red light supplying a test data signal for electro-optical elements outgoing red light, a test data signal for green light supplying a test data signal for electro-optical elements outgoing green light and a test data signal for blue light supplying a test data signal for electro-optical elements outgoing blue light.

In the invention, it is preferable that the electro-optical element is an electroluminescent element.

According to the electro-optical device, the test of an electroluminescent element can be performed.

In the invention, it is preferable that the electroluminescent element includes a light emitting layer made of an organic light emitting material.

According to the electro-optical device, the test of an organic electroluminescent element can be performed.

BRIEF DESCRIPTION OF THE DRAWINGS

The invention will be described with reference to the accompanying drawings, wherein like numbers reference like elements.

DETAILED DESCRIPTION OF EMBODIMENTS

Hereinafter, exemplary embodiments of the electro-optical device of the invention will be described with reference to the accompanying drawings.

Figure 1:
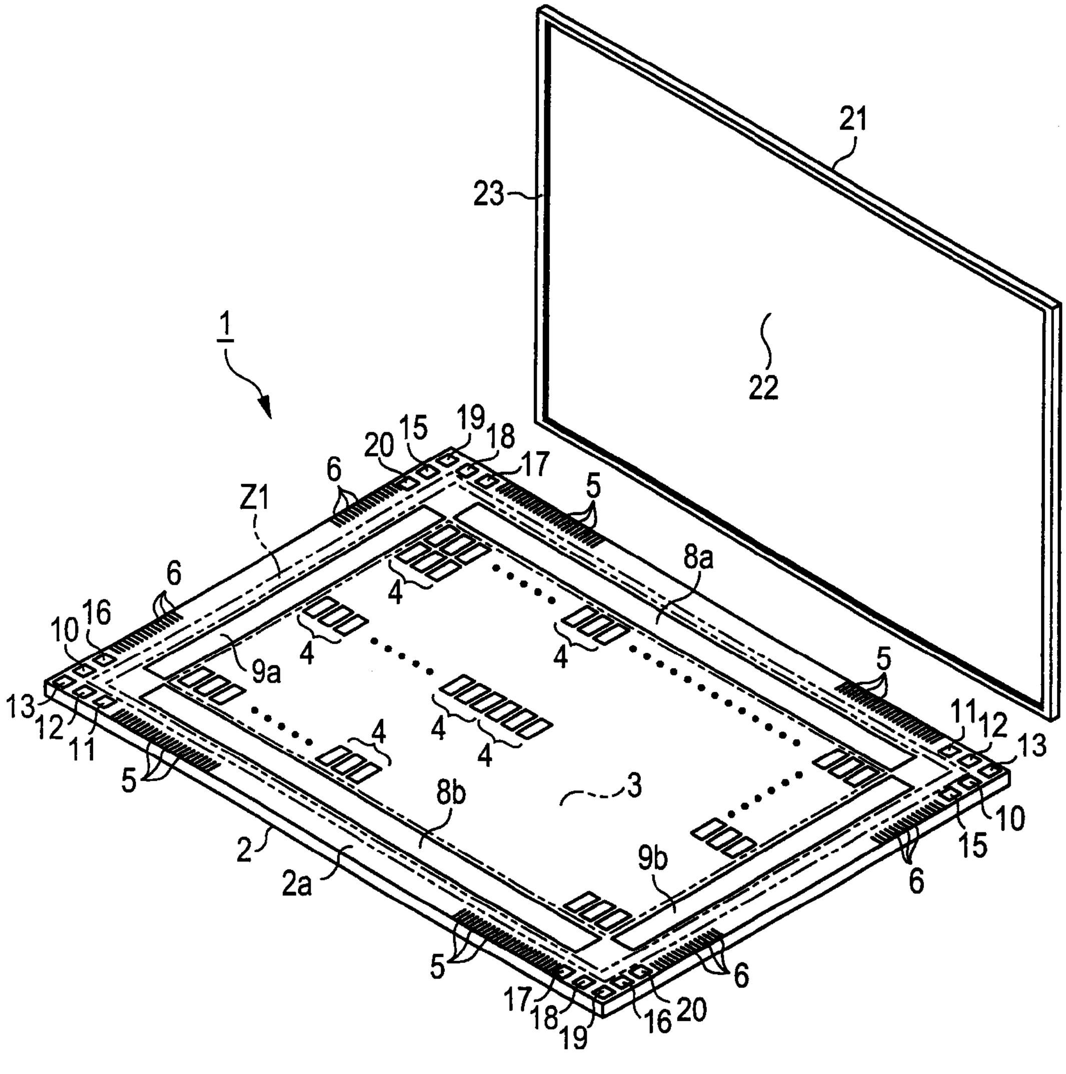
FIG. 1 is a perspective view illustrating an organic EL display according to the invention.
Figure 2:
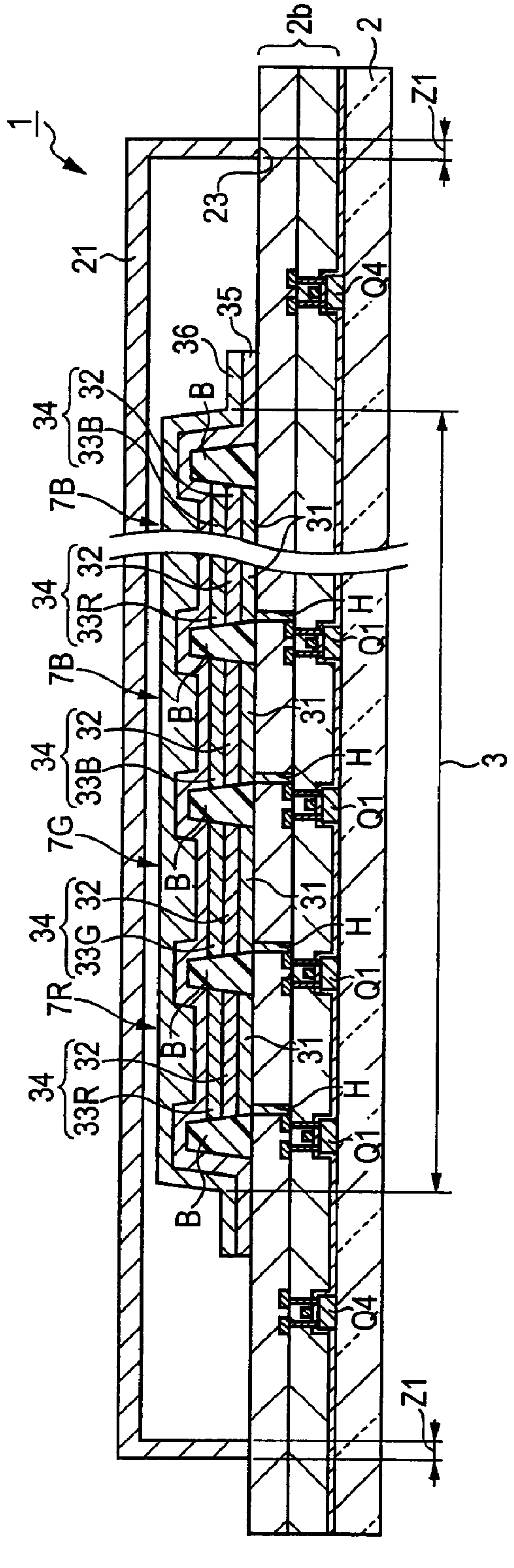
FIG. 2 is a cross-sectional view illustrating main portions of an organic EL display.

FIG. 1 is a perspective view illustrating an organic EL display, and FIG. 2 is a cross-sectional view illustrating main portions of an organic EL display according to the invention.

As shown in FIG. 1, an organic EL display 1, which is an electro-optical device, has a rectangular transmissive substrate 2. The transmissive substrate 2 is formed with a non-alkali glass substrate.

In a surface of the transmissive substrate 2 (an element forming surface) 2*a*, a rectangular display region 3, which is bounded by two-dot chain line, is formed. In the display region 3, as shown in FIG. 1, a matrix of m×n pixels 4 is formed. In detail, n column of m pixels group per row or m row of n pixels group per column is formed in the display region 3.

Figure 3:
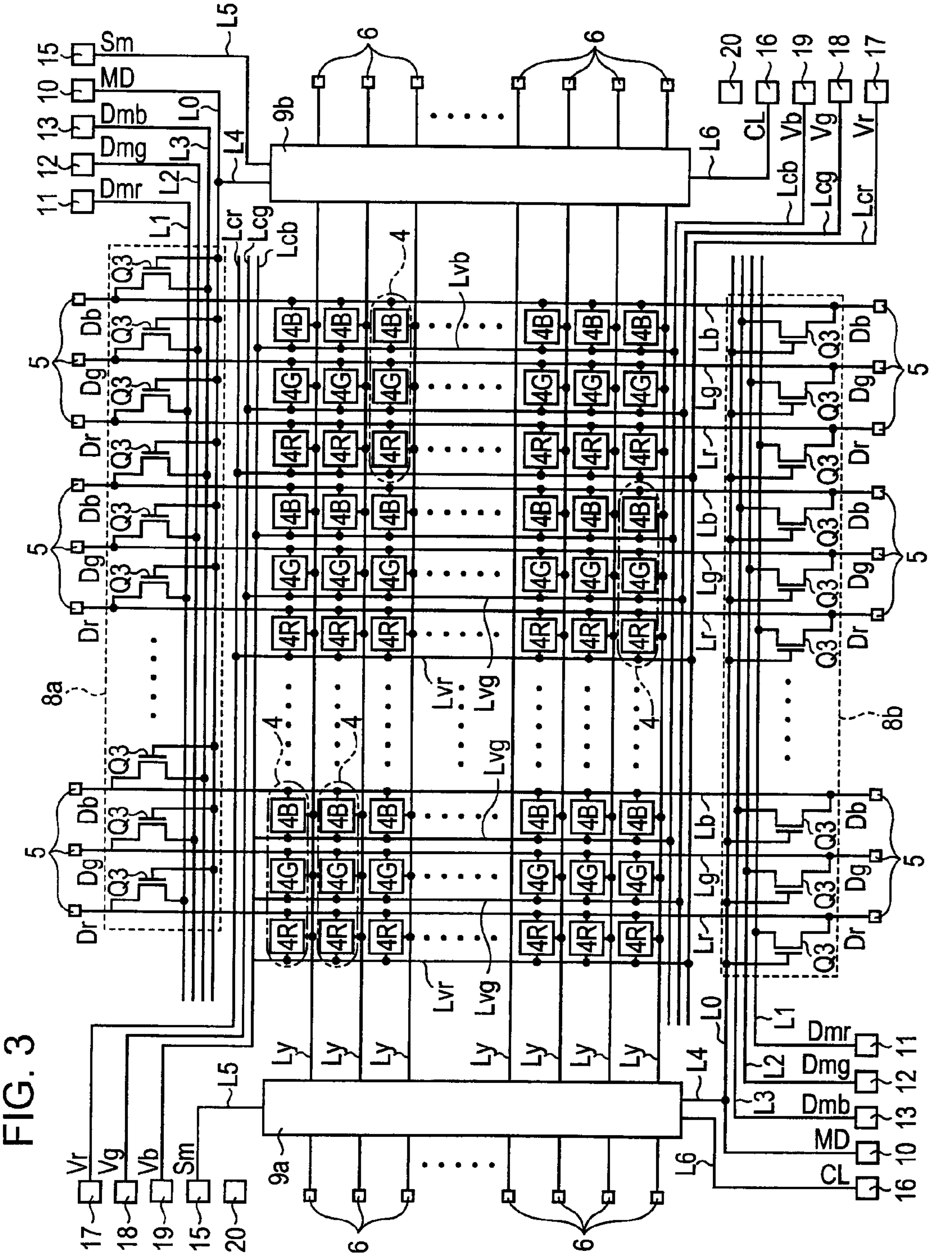
FIG. 3 is an electric circuit diagram illustrating an electric configuration of an organic EL display.

As shown in FIG. 3, each pixel 4 is constituted by three kinds of pixel circuit including a pixel circuit for red light 4R having an organic EL element 7 for red light (see FIG. 4) outgoing red light, a pixel circuit for green light 4G having an organic EL element 7 for green light (see FIG. 4) outgoing green light, and a pixel circuit for blue light 4B having an organic EL element 7 for blue light (see FIG. 4) outgoing blue light. The pixel circuits for red, green and blue light 4R, 4G, 4B as a unit circuit are disposed in order of a pixel circuit for red light 4R, a pixel circuit for green light 4G, a pixel circuit for blue light 4B along row direction. That is, each pixel circuit 4R, 4G, 4B is repeatedly disposed in order of a pixel circuit for red light 4R, a pixel circuit for green light 4G, a pixel circuit for blue light 4B, a pixel circuit for red light 4R, a pixel circuit for green light 4G along row direction.

In addition, the pixel circuits of the same color 4R, 4G, 4B are disposed along column direction.

In a display region 3, data lines Lr, Lg, Lb are formed, respectively, corresponding to the pixel circuits of each color 4R, 4G, 4B disposed in each column direction, and thereby data signals Dr, Dg, Db are supplied, respectively, to the pixel circuits of the same color 4R, 4G, 4B disposed in the column direction.

In addition, a plurality of scanning lines Ly is formed, respectively, corresponding to the pixel circuits of each color 4R, 4G, 4B disposed repeatedly in each row direction, and thereby selection signals Sy (see FIG. 4) are supplied, respectively, to each pixel circuit 4R, 4G, 4B disposed in the row direction. That is, each pixel circuit 4R, 4G, 4B is formed in an intersecting region between each of the corresponding data lines Lr, Lg, Lb and each of the corresponding scanning lines Ly.

Both upper and lower end of each data line Lr, Lg, Lb formed in column direction are extended and formed to Both upper and lower end of a transmissive substrate 2, and are electrically connected to a data line external terminal 5 formed on the end portion except left and right corner of both upper and lower side of the transmissive substrate 2.

The data line external terminal 5, which is a data signal input terminal formed corresponding to each data line Lr, Lg, Lb, is a terminal formed with copper or the like, and is arranged and formed on a surface (element forming surface) 2*a* along the upper and lower side as a second side of the transmissive substrate 2 at regular pitches.

Moreover, each of the data line external terminals 5, not shown, of each of the upper and lower sides is electrically connected with a plurality of connection terminals formed on a flexible substrate for data line whose body is formed with a polyimide resin according to so-called anisotropic conductive film (ACF) system.

IC chip for data line drive is mounted in the flexible substrate, and the data signals Dr, Dg, Db supplied from the IC chip for data line drive to each pixel circuit 4R, 4G, 4B are outputted. Further, in the embodiments, each data line Lr, Lg, Lb synchronizes and supplies the identical data signals Dr, Dg, Db from both the upper and lower side to each pixel circuit 4R, 4G, 4B through the corresponding data line external terminal 5.

Meanwhile, both left and right end of a plurality of scanning lines Ly formed in row direction are extended and formed to Both left and right end of a transmissive substrate 2, and are electrically connected to a scanning line external terminal 6 formed on the end portion except left and right corner of both upper and lower side of the transmissive substrate 2.

The scanning line external terminal 6, which is a selection signal input terminal formed corresponding to each scanning line Ly is a terminal formed with copper or the like, and is arranged and formed on a surface (element forming surface) 2*a* along the left and right side as a first side of the transmissive substrate 2 at regular pitches.

Moreover, each of the scanning line external terminals 6, not shown, of each of the left and right sides is electrically connected with a plurality of connection terminals formed on a flexible substrate for scanning line whose body is formed with a polyimide resin according to the anisotropic conductive film (ACF) system.

IC chip for scanning line drive is mounted in the flexible substrate, and a selection signal Sy is outputted from the IC chip for scanning line drive to each scanning line Ly. Further, in the embodiments, each scanning line Ly synchronizes and supplies the selection signal Sy from both the left and right ends to each pixel circuit 4R, 4G, 4B through the corresponding scanning line external terminal 6.

In a display region 3, a plurality of power source lines Lvr, Lvg, Lvb are formed, respectively, corresponding to the pixel circuits of each color 4R, 4G, 4B disposed in each column direction, and thereby drive voltages Vr, Vg, Vb (see FIG. 4) are supplied, respectively, to the pixel circuits of the same color 4R, 4G, 4B disposed in the column direction.

Moreover, both upper and lower end of the plurality of power source lines Lvr, Lvg, Lvb are electrically connected to the corresponding common power source lines Lcr, Lcg, Lcb along row direction, respectively.

The left sides of common power source lines Lcr, Lcg, Lcb formed in upper side are extended and formed to the left end of a transmissive substrate 2, and are electrically connected to a power source line external terminals for test of red, green and blue light 17, 18, 19 formed at left upper corner of the transmissive substrate 2.

Moreover, The right sides of common power source lines Lcr, Lcg, Lcb formed in lower side are extended and formed to the right end of a transmissive substrate 2, and are electrically connected to a power source line external terminals for test of red, green and blue light 17, 18, 19 formed at right lower corner of the transmissive substrate 2.

In the external terminals for test, the power source line external terminals for test of red, green and blue light 17, 18, 19 are supplied with drive voltages Vr, Vg, Vb from a test device (not shown) when the test is performed before shipment.

Moreover, the power source line external terminals for test of red, green and blue light 17, 18, 19 are the terminals made of a copper foil or the like.

Since these external terminals for test 17, 18, 19 are provided at corners and the number of them is small, these external terminals for test are formed by larger size than that of the data line external terminal 5 or the scanning line external line 6 or the like.

Meanwhile, the left sides of common power source lines Lcr, Lcg, Lcb formed in upper side and the right sides of common power source lines Lcr, Leg, Lcb formed in lower side are electrically connected with the common power source line external terminals, not shown, formed adjacent to the data line external terminals 5. The common power source line external terminals, not shown, are formed by the same method as the data line external terminals 5, and are electrically connected with a connection terminal for power supply formed on a flexible substrate for data line. Further, in the embodiment, the drive voltages Vr, Vg, Vb supplied to each power source lines Lvr, Lvg, Lvb are outputted from the connection terminal formed on the flexible substrate for data line. Accordingly, the power source lines Lvr, Lvg, Lvb are supplied with the drive voltages Vr, Vg, Vb from both upper and lower end through the corresponding common power source lines Lcr, Lcg, Lcb.

Figure 4:
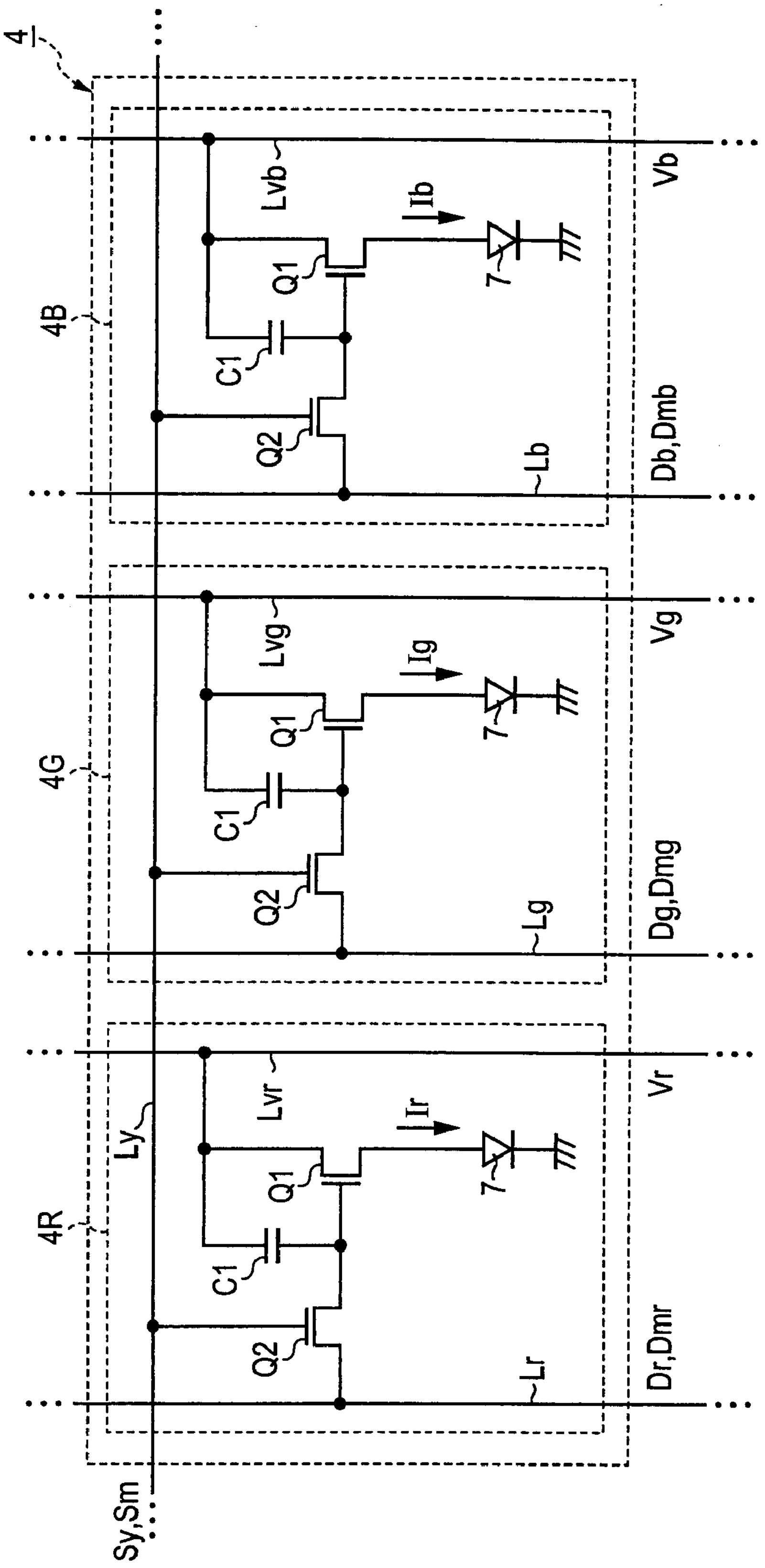
FIG. 4 is an electric circuit diagram illustrating a pixel circuit.

FIG. 4 shows an circuit configuration of a pixel circuit for red light 4R, a pixel circuit for green light 4G and a pixel circuit for blue light 4B constituting a pixel 4.

For convenient description, a pixel circuit for red light 4R will now be described, other pixel circuits 4G, 4B will be omitted.

The pixel circuit for red light 4R includes a drive transistor Q1, a switching transistor Q2 and a holding capacitor C1, respectively. The drive transistor Q1 and switching transistor Q2 are constituted by a thin film transistor (TFT) whose conductivity type is N channel. In the drive transistor Q1, a source is connected to the positive electrode of organic luminescent element as an electro-optical element outgoing red light, and a drain is connected to the corresponding power source line Lvr.

A gate of the drive transistor Q1 is connected with the holding capacitor C1. Other end of the holding capacitor C1 is connected to the power source line Lvr.

A gate of the switching transistor Q2 is connected to the scanning line Ly. Moreover, a drain of the switching transistor Q2 is connected to the data line Lr, and a source of the switching transistor Q2 is connected to the ends of the gate of the drive transistor Q1 and the holding capacitor C1.

Accordingly, in the pixel circuit for green light 4G, a drain of the drive transistor Q1 is connected to the power source line Lvg, and a drain of the switching transistor Q2 is connected to the data line Lg. Further, the organic EL element 7 of the pixel circuit for green light is an organic EL element outgoing green light.

Similarly, in the pixel circuit 4B, a drain of the drive transistor Q1 is connected to the power source line Lvb, and a drain of the switching transistor Q2 is connected to the data line Lb. Further, the organic EL element 7 of the pixel circuit for blue light is an organic EL element outgoing blue light.

Further, if a selection signal Sy is outputted to a scanning line during a predetermined time, the switching transistor Q2 of a pixel circuit for red light 4R, a pixel circuit for green light 4G and a pixel circuit for blue light 4B is ON during a predetermined time, whereby data signals Dr, Dg, Db are supplied through data lines Lr, Lg, Lb, respectively. Next, the data signals Dr, Dg, Db are supplied to a holding capacitor C1 through the switching transistor Q2, respectively. The holding capacitor C1 of each pixel circuits 4R, 4G, 4B accumulates and holds charge quantity corresponding to the data signals Dr, Dg, Db.

Moreover, an electric potential of the gate terminal of the drive transistor Q1 of each pixel circuits 4R, 4G, 4B is boosted-up, and thereby a drive current Ir, Ig, Ib according to the data signals Dr, Dg, Db in the drain/source of the drive transistor Q1 is supplied to the organic EL element 7.

This drive current Ir, Ig, Ib is a relative value to charge quantity according to the data signals Dr, Dg, Db accumulated in the holding capacitor C1.

That is, the drive transistor Q1 is conducted in response to data signals Dr, Dg, Db, the conduction state thereof is held, and thereby the drive current Ir, Ig, Ib is supplied to the organic EL element 7. Next, at this time, the organic EL element 7 of each pixel circuits 4R, 4G, 4B emits light by a relative brightness to data signals Dr, Dg, Db, respectively.

With such a configuration, in each pixel 4, in FIG. 3, constituted by each pixel circuits 4R, 4G, 4B disposed and formed in a display region in a matrix pattern, a selection signal Sy is outputted from an upper side scanning line to a lower side scanning line in order during a predetermined time. Further, the data signals Dr, Dg, Db are simultaneously supplied through data lines Lr, Lg, Lb with respect to each selected pixel 4 (pixel circuits 4R, 4G, 4B) on the scanning line Ly where the selection signal Sy is outputted, and the organic EL element 7 in each selected pixels 4 (pixel circuits 4R, 4G, 4B) on the scanning line Ly emits light. That is, each pixel 4 is light-emitting controlled from the most upper scanning line to most lower scanning line in order to display one frame image in a display region 3 in so-called line order.

FIG. 2 is a cross-sectional view illustrating main portions of an organic EL display 1 showing the structure of each organic EL element 7 of pixel circuits 4R, 4G, 4B.

Incidentally, for convenient description, an organic EL element 7 outgoing red light is designated as an organic EL element for red light 7R, an organic EL element 7 outgoing green light is designated as an organic EL element for green light 7G, and an organic EL element 7 outgoing blue light is designated as an organic EL element for blue light 7B.

As shown in FIG. 2, each organic EL element 7R, 7G, 7B is formed on a circuit forming layer 2*b* formed on an element forming surface 2*a* of the transmissive substrate 2. In the circuit forming layer 2*b*, a circuit element such as a drive transistor Q1 for driving each of the pixel circuits 4R, 4G, 4B formed in a display region 3, or all or part of a circuit element constituting test circuit parts for data line control 8*a*, 8*b* and test circuit parts for scanning line control 9*a*, 9*b*, as will hereinafter be described, formed outside a display region 3.

In addition, in a region corresponding to a display region 3 on the circuit forming layer 2*b*, banks B for partitioning each organic EL element 7R, 7G, 7B in a matrix pattern are formed. A positive electrode (pixel electrode or individual electrode) 31 is formed at each bottom of concave regions partitioned by each bank B. In the embodiment, the positive electrode 31 is made of indium-tin compound (ITO) which is conductive material with optical transparency as a transmissive electrode.

Each of the positive electrodes 31 electrically connected with the corresponding drive transistor Q1 through a contact hole H. In the embodiment, a functional layer 34 which is laminated in order as a positive-hole transfer layer 32, light-emitting layers 33R, 33G, 33B is formed on each of the positive electrodes 31. The light-emitting layer 33R is a layer which is made of an organic light-emitting material outgoing red light, the light-emitting layer 33G is a layer which is made of an organic light-emitting material outgoing green light, and the light-emitting layer 33B is a layer which is made of an organic light-emitting material outgoing blue light.

A negative electrode 35, which is a common electrode, is formed over a whole surface on the functional layer 34. The negative electrode 35 is formed with an aluminum film. A protective film is formed to cover a whole surface of the negative electrode 35. Each organic EL element 7 (7R, 7G, 7B) is constituted by laminating the positive electrode 31, functional layer 34 and negative electrode 35.

Further, light emitted from each of the organic EL elements 7 (7R, 7G, 7B) is emitted to lower side through the positive electrode 31 of the transmissive electrode, as shown in FIG. 2. Moreover, light emitted toward the negative electrode 35 is reflected by the negative electrode 35 formed with an aluminum film, and then is emitted to lower side through the positive electrode 31. Accordingly, the organic EL display 1 of the embodiment is a bottom emission type display.

As shown FIG. 1, in an element forming surface 2*a* of both upper and lower transmissive substrate 2 adjacent to the display region 3, test circuit parts for data line control 8*a*, 8*b*, which is a test circuit for data line, are formed in row direction. As shown FIG. 3, a gate transistor Q3 is provided in the upper and lower test circuit parts for data line control 8*a*, 8*b* corresponding to each data line Lr, Lg, Lb, respectively. The gate transistor Q3 is constituted by a thin film transistor (TFT) whose conductivity type is N channel. A gate of each gate transistor Q3 is electrically connected to a test mode signal supply line L0 formed along row direction. Further, if a test mode signal MD with high electric potential (H level) for test is supplied, each of the gate transistors Q3 is simultaneously ON.

A source of each gate transistor Q3 is electrically connected to the corresponding data lines Lr, Lg, Lb, respectively. In each of the gate transistors Q3, a drain of the gate transistor Q3 is electrically connected to a test data signal supply line for red light L1 along row direction in each gate transistor Q3 whose source is connected to the data line for red light Lr. Further, in each of the gate transistor Q3, a drain of the gate transistor Q3 is electrically connected to a test data signal supply line for red light L2 along row direction in each gate transistor Q3 whose source is connected to the data line for green light Lg. Further, in each of the gate transistor Q3, a drain of the gate transistor Q3 is electrically connected to a test data signal supply line for blue light L3 along row direction in each gate transistor Q3 whose source is connected to the data line for red light Lb.

Each supply line L0, L1, L2, L3 of the upper test circuit parts for data line control 8*a* is formed adjacently each other, and the right portion thereof is extended and formed to a right upper corner of four corners of the transmissive substrate 2. Further, a test mode signal supply line LO is electrically connected to a test mode signal external terminal 10 formed at a right upper corner of the transmissive substrate 2. A test data signal supply line for red light L1 is electrically connected to a test data external terminal for red light 11 formed at a right upper corner of the transmissive substrate 2. A test data signal supply line for green light L2 is electrically connected to a test data external terminal for green light 12 formed at a right upper corner of the transmissive substrate 2. A test data signal supply line for blue light L3 is electrically connected to a test data external terminal for blue light 13 formed at a right upper corner of the transmissive substrate 2.

Similarly, each supply line L0, L1, L2, L3 of the lower test circuit parts for data line control 8*b* is also formed adjacently each other, and the left portion thereof is extended and formed to a left lower corner of four corners of the transmissive substrate 2. Further, as similar with the upper test circuit parts for data line control 8*a*, a test mode signal supply line L0 is electrically connected to a test mode signal external terminal 10, a test data signal supply line for red light L1 is electrically connected to a test data external terminal for red light 11, a test data signal supply line for green light L2 is electrically connected to a test data external terminal for green light 12, and a test data signal supply line for blue light L3 is electrically connected to a test data external terminal for blue light 13.

External terminals 10, 11, 12, 13 connected to each supply line L0, L1, L2, L3 of the upper and lower test circuit parts for data line control 8*a*, 8*b* is formed with a copper foil or the like. Further, since these external terminals 10, 11, 12, 13 are provided at corners and the number of them is small, these external terminals are formed by larger size than that of the data line external terminal 5 or the scanning line external line 6 or the like.

These External terminals 10, 11, 12, 13, which are external terminals for test, is supplied with test mode signal MD and test data signals Dmr, Dmg, Dmb when the test is performed before shipment. Further, in state that the test mode signal MD is supplied from a test mode signal external terminal 10 for test, if the test data signals Dmr, Dmg, Dmb are supplied to each of the test data external terminals 11, 12, 13, the test data signals Dmr, Dmg, Dmb are supplied to the corresponding data lines Lr, Lg, Lb through a gate transistor Q3.

Figure 5:
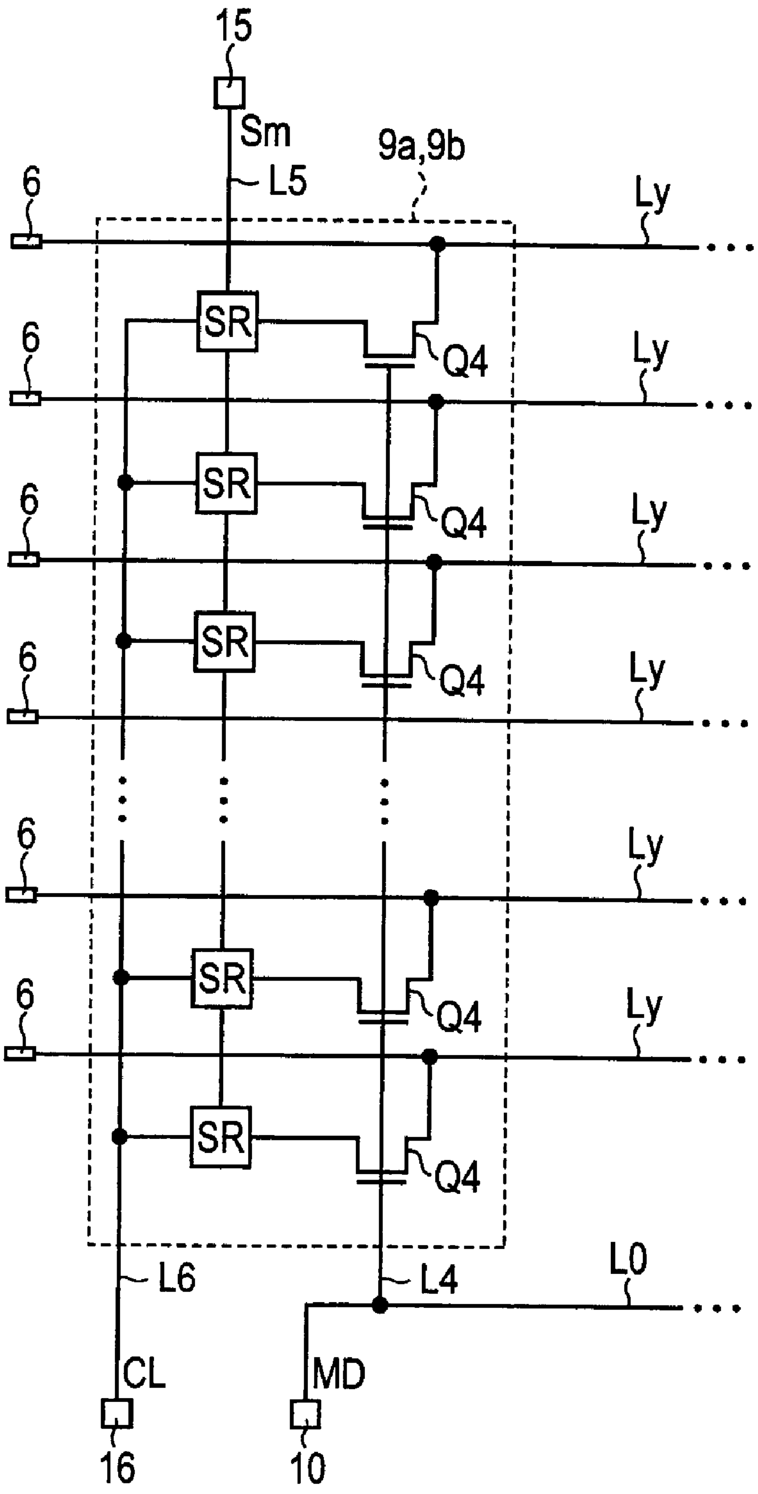
FIG. 5 is an electric circuit diagram illustrating a test circuit part for scanning line control.

In FIG. 1, test circuit parts for scanning line control 9*a*, 9*b* as a test circuit for scanning line are formed in an element forming surface 2*a* of both left and right transmissive substrate 2 adjacent to the display region 3. As shown in FIG. 5, a gate transistor Q4 and a shift register SR are provided in the left and right test circuit parts for scanning line control 9*a*, 9*b* corresponding to each scanning line, respectively.

The gate transistors Q4 are constituted by a thin film transistor (TFT) whose conductivity type is N channel. Each gate of the gate transistors Q4 is electrically connected to a test mode signal supply line L4 formed along row direction. One end of the test mode signal supply line L4 is connected to the test mode signal supply line L0. Accordingly, if a test mode signal MD of H level for test is supplied to the test mode signal supply line L4, each gate transistor Q4 is simultaneously ON. The source of each gate transistor Q4 is connected to the corresponding scanning line Ly, respectively, and the drain of each gate transistor Q4 is connected to the corresponding shift register SR, respectively.

Each of the shift register SR is serially connected, and the shift register SR corresponding to the most upper scanning line Ly is connected to a selection signal supply line L5. Further, in the shift register SR corresponding to the most upper scanning line Ly, a selection signal Sm of H level for test supplied from the selection signal supply line L5 is inputted. Each of the shift register SR is electrically connected to a clock signal supply line L6 formed along row direction, and thereby inputs a clock signal CL supplied from the clock signal supply line L6.

Further, the selection signal Sm of H level inputted to the most upper shift register SR is shifted from the upper shift register SR to the lower shift register SR in response to the clock signal CL. Accordingly, the shift register SR to which the selection signal Sm is shifted and inputted outputs the selection signal Sm of H level to the corresponding scanning line Ly through the gate transistor Q4 until next clock signal CL is generated. Accordingly, the scanning line Ly is selected from the upper scanning line Ly to the lower scanning line Ly in order according to the selection signal Sm synchronized with the clock signal CL and shifted.

The end of the supply line L5 of the left test circuit part for scanning line control 9*a* is extended and formed to a left upper corner of four corners of the transmissive substrate 2. Further, a selection signal supply line L5 is electrically connected to a selection signal external terminal 15 formed at a left upper corner of the transmissive substrate 2. A clock signal supply line L6 is electrically connected to a clock signal external terminal 16 formed at a left lower corner of the transmissive substrate 2.

The end of the supply line L5 of the right test circuit part for scanning line control 9*b* is extended and formed to a right upper corner of four corners of the transmissive substrate 2. Further, a selection signal supply line L5 is electrically connected to a selection signal external terminal 15 formed at a right upper corner of the transmissive substrate 2. A clock signal supply line L6 is electrically connected to a clock signal external terminal 16 formed at a right lower corner of the transmissive substrate 2.

The selection signal external terminal 15 and clock signal external terminal 16 of the left and right test circuit parts for scanning line control 9*a*, 9*b* are formed with a copper foil or the like. Further, since the selection signal external terminal 15 and clock signal external terminal 16 are provided at corners, respectively and the number of them is small, they are formed by larger size than that of the data line external terminal 5 or the scanning line external line 6 or the like.

These external terminals 15, 16, which are external terminals for test, is supplied with selection signal Sm and clock signal CL from a test device when the test is performed before shipment. Further, in state that each gate transistor Q4 is ON, and the selection signal Sm is supplied from the selection signal external terminal 15, the clock signal CL is supplied to the selection signal external terminal 15, and the selection signal Sm is supplied corresponding to each of the scanning line Ly in order.

In FIG. 1, outside of the region surrounding test circuit parts for data line control 8*a*, 8*b* and test circuit parts for scanning line control 9*a*, 9*b*, an attaching region Z1 of a sealing substrate 21 by using a sealing member is provided in the element forming surface 2*a* of the transmissive substrate 2 of inside of each of the external terminals for test 5, 6, 10, 11, 12, 13, 15, 16, 17, 18, 19, 20. The sealing substrate 21 is made of stainless steel, a receiving concave portion 22 is provided in a surface of the sealing substrate 21 in a direction of the transmissive substrate 2, and an outer circumferential edge 23 of the sealing substrate 21 formed in rectangular ring shape becomes an attaching surface, and thereby the sealing substrate 21 is attached to the transmissive substrate 2 through an adhesive in the attaching region Z1. At this time, as shown in FIG. 2, the test circuit parts for scanning line control 9*a*, 9*b* (test circuit parts for data line control 8*a*, 8*b* are the same as well) are formed between the attaching region Z1 and the display region 3. Accordingly, each of the test circuit parts 8*a*, 8*b*, 9*a*, 9*b* and each of the pixel circuits 4R, 4G, 4B formed in the display region 3 excepting the external terminals 5, 6, 10, 11, 12, 13, 15, 16, 17, 18, 19, 20 are included and sealed in the receiving concave portion 22 of the sealing substrate 21. As a result, each of the test circuit parts 8*a*, 8*b*, 9*a*, 9*b* and each of the pixel circuits 4R, 4G, 4B are protected from moisture or oxygen or the like by the sealing substrate 21.

The external terminals for test 10, 11, 12, 13, 15, 16, 17, 18, 19, 20 are divided and formed at four corners of the transmissive substrate 2 outside a sealing region which is sealed by the sealing substrate 21. As shown in FIG. 1, the selection signal external terminal 15 and power source line external terminals for test 17, 18, 19 are disposed at left upper corner, and the test mode signal external terminal 10, clock signal external terminal 16 and test data external terminal 11, 12, 13 are disposed at left lower corner, respectively. Further, the clock signal external terminal 16 and power source line external terminals for test 17, 18, 19 are disposed at right lower corner, and the test mode signal external terminal 10, selection signal external terminal 15 and test data external terminal 11, 12, 13 are disposed at right upper corner, respectively. Further, a ground external terminal 20, which is an external terminal for test, connected with a test probe of a test device is formed at left upper and right lower corners, respectively, and this ground external terminal 20 is electrically connected with a negative electrode of the organic EL element 7 of each of the pixel circuits 4R, 4G, 4B. Further, in the embodiment, five external terminals for test are perpendicularly arranged and formed along the corners, and thereby is used as an alignment mark when the sealing substrate 21 is attached to a transmissive substrate 2.

Next, a test method of the organic EL display 1 will be described. The test of organic EL display 1 is performed by using a test device to test a bright spot and a scotoma spot.

First, each of the external terminals 10, 11, 12, 13, 15, 16, 17, 18, 19, 20 formed at corners of the transmissive substrate 2 is connected to the corresponding probe of a test device, respectively. That is, the test mode signal external terminal 10 is connected to the probe supplying a test mode signal MD. The test data external terminal for red light 11 is connected to the probe supplying a test data signal for red light Dmr. The test data external terminal for green light 12 is connected to the probe supplying a test data signal for green light Dmg. The test data external terminal for blue light 13 is connected to the probe supplying a test data signal for blue light Dmb. Further, the selection signal external terminal 15 is connected to the probe supplying a selection signal Sm. The clock signal external terminal 16 is connected to the probe supplying a clock signal CL. Further, each of the power source line external terminals for red, green and blue light 17, 18, 19 is connected to the probe supplying a drive voltage Vr, Vg, Vb, respectively. The ground external terminal 20 is connected to a ground probe.

Further, the test device outputs a test mode signal MD of high level to the test mode signal external terminal 10 in state that each of the drive voltages Vr, Vg, Vb is supplied to each of the power source line external terminals for red, green and blue light 17, 18, 19. Next, the gate transistor Q3 of the upper and lower test circuit parts for data line control 8*a*, 8*b* and the gate transistor Q4 of the left and right test circuit parts for scanning line control 9*a*, 9*b* are simultaneously ON. In this state, the selection signal Sm of high level is outputted to the selection signal external terminal 15, and the test data signals for red, green and blue light Dmr, Dmg, Dmb are outputted to the test data external terminals for red, green and blue light 11, 12, 13.

As a result, the most upper scanning line Ly is selected, in each of the pixel circuits 4R, 4G, 4B on the selected scanning line Ly, the test data signals for red, green and blue light Dmr, Dmg, Dmb are supplied and held through the data lines Lr, Lg, Lb, and thereby the organic EL element 7 is light-emitted on the basis of the test data signals for red, green and blue light Dmr, Dmg, Dmb.

Further, then, every time the clock signal CL is supplied to the clock signal external terminal 16, the selection signal Sm is shifted to a shift register SR, and thereby the organic EL element 7 of each of the pixel circuits 4R, 4G, 4B on the selected scanning line Ly is also light-emitted. Further, if the most lower scanning line is selected and the organic EL element 7 of each of the pixel circuits 4R, 4G, 4B on the selected scanning line Ly is light-emitted, all of the pixel circuits 4R, 4G, 4B are light-emitted by brightness based on the test data signals for red, green and blue light Dmr, Dmg, Dmb.

Next, defective pixels 4 are tested according to display state of this display region. For example, when a scotoma spot test is performed, the test device supplies the test data signals for red, green and blue light Dmr, Dmg, Dmb from which the organic EL element 7 is light-emitted by the highest brightness to each of the pixel circuits 4R, 4G, 4B, and thereby emits each of the pixels 4 by the highest brightness. In this state, the defective pixels 4 which are not light-emitted within display region 3 are tested.

When a bright spot test is performed, the test device supplies the test data signals for red, green and blue light Dmr, Dmg, Dmb from which the organic EL element 7 is not light-emitted to each of the pixel circuits 4R, 4G, 4B, and thereby does not emit each pixel 4 in display region 3. In this state, the defective pixel 4 which is light-emitted within display region 3 is tested.

As described above, according to the embodiment, advantages of the invention is followed.

(1) According to the embodiment, it is possible to perform a defective pixel test such as a bright spot test, a scotoma spot test, or the like by only applying the probe of the test device to each of the external terminals for test 10, 11, 12, 13, 15, 16, 17, 18, 19, 20 formed at four corners of the transmissive substrate 2. Moreover, since each of the external terminals is formed outside corners than the sealing substrate 21, it is possible to perform the test after the sealing substrate 21 is attached.

(2) According to the embodiment, each of the external terminals for test 10, 11, 12, 13, 15, 16, 17, 18, 19, 20 is formed at four corners of the transmissive substrate 2. That is, the external terminals for test 10, 11, 12, 13, 15, 16, 17, 18, 19, 20 are formed at corners of the transmissive substrate 2 which is spaced-sufficiently deviated from the external terminals 5, 6 of each of the data lines and each of the scanning lines formed at one side of the transmissive substrate 2 on the extended line of each of the data lines Lr, Lg, Lb and each scanning lines Ly. Accordingly, it is possible to increase the size of the external terminals for test 10, 11, 12, 13, 15, 16, 17, 18, 19, 20 than that of the external terminals 5, 6 without increasing the size(frame part) of the transmissive substrate 2. Further, since the size of the external terminals for test 10, 11, 12, 13, 15, 16, 17, 18, 19, 20 can be increased, it is possible to easily connect the probe of the test device to the external terminals 10, 11, 12, 13, 15, 16, 17, 18, 19, 20 with high precision during a short time.

(3) According to the embodiment, the external terminals for test 10, 11, 12, 13, 15, 16, 17, 18, 19, 20 are used as an alignment mark when the sealing substrate 21 is formed outside and is attached to the transmissive substrate 2. Accordingly, it is not necessary to secure the region forming an alignment mark only for attaching the sealing substrate 21 to the transmissive substrate 2, and it is possible to omit a manufacturing process by just that much. Moreover, since the external terminals for test 10, 11, 12, 13, 15, 16, 17, 18, 19, 20 are perpendicularly arranged and formed along four corners, it is possible to attach the sealing substrate 21 to the transmissive substrate 2 with high precision.

Furthermore, since the external terminals for test 10, 11, 12, 13, 15, 16, 17, 18, 19, 20 can be previously formed before the functional layer 34 of the organic EL element 7R, 7B, 7G is formed, it is possible to use the external terminals for test as an alignment mark when the functional layer 34 of the organic EL element 7R, 7B, 7G is formed in an ink-jet type. That is, it is possible to use the external terminals for test as an alignment mark of the various manufacturing process performed after the external terminals for test 10, 11, 12, 13, 15, 16, 17, 18, 19, 20 is formed.

(4) According to the embodiment, test circuits, that is, the upper and lower test circuit parts for data line control 8*a*, 8*b* and the left and right test circuit parts for scanning line control 9*a*, 9*b* are formed at the position where the test circuits is included in the receiving concave portion. Accordingly, each of the test circuit parts 8*a*, 8*b*, 9*a*, 9*b* is completely protected from external moisture, oxygen or the like. Further, since each of the test circuit parts 8*a*, 8*b*, 9*a*, 9*b* is formed inside of the attaching region Z1 (between the display region 3 and the attaching region Z1) which is not directly faced against the attaching surface of the sealing substrate 21, the force applied to the sealing substrate 21, for example, the force by which the sealing substrate 21 is attached to the transmissive substrate 2 when the sealing substrate 21 is attached to the substrate 2 is not directly applied through the attaching surface. As a result, each of the test circuit parts 8*a*, 8*b*, 9*a*, 9*b* can not be deteriorated by the force applied to the sealing substrate 21 according to any cause.

(5) According to the embodiment, the sealing substrate 21 is formed with a stainless steel. Accordingly, since an external electromagnetic noise is completely cut off by the sealing substrate 21, each of the test circuit parts 8*a*, 8*b*, 9*a*, 9*b* can not malfunction by the electromagnetic noise.

(6) According to the embodiment, since the upper and lower test circuit parts for data line control 8*a*, 8*b* are constituted by only gate transistor Q3 provided to each of the data lines Lr, Lg, Lb, the size of the circuit is reduced, and thereby it is possible to increase the size of the display region 3 by just that much. Further, since the size of the circuit is reduced, the upper and lower test circuit parts for data line control 8*a*, 8*b* are easily included in the receiving concave portion 22 of the sealing substrate 21.

(7) According to the embodiment, the left and right test circuit parts for scanning line control 9*a*, 9*b* are constituted by only gate transistor Q4 and shift register SR provided to the scanning lines Ly, the size of the circuit is reduced, and thereby it is possible to increase the size of the display region 3 by just that much. Further, since the size of the circuit is reduced, the left and right test circuit parts for scanning line control 9*a*, 9*b* are easily included in the receiving concave portion 22 of the sealing substrate 21.

Furthermore, the embodiments of the invention is not limited by the above described embodiments, the invention can apply to below.

In the above described embodiment, although the test circuit is performed by light-emitting each organic EL element 7R, 7G, 7B, the invention is not limited to it, and the invention can apply to the test circuit of the test object such as drive transistor Q1, wiring, or the like.

In the above described embodiment, although the external terminals for test 10, 11, 12, 13, 15, 16, 17, 18, 19, 20 are all input terminals for inputting a signal from the test device, they may be output terminals for outputting a signal to the test device.

In the above described embodiment, the upper and lower test circuit parts for data line control 8_a_, 8_b_ are constituted to simultaneously output the test data signals for red, green and blue light Dmr, Dmg, Dmb to all of the data lines Lr, Lg, Lb when one scanning line Ly is selected. They may be modified and applied to the upper and lower test circuit parts for data line control 8_a_, 8_b_ shown in FIG. 6.

Figure 6:
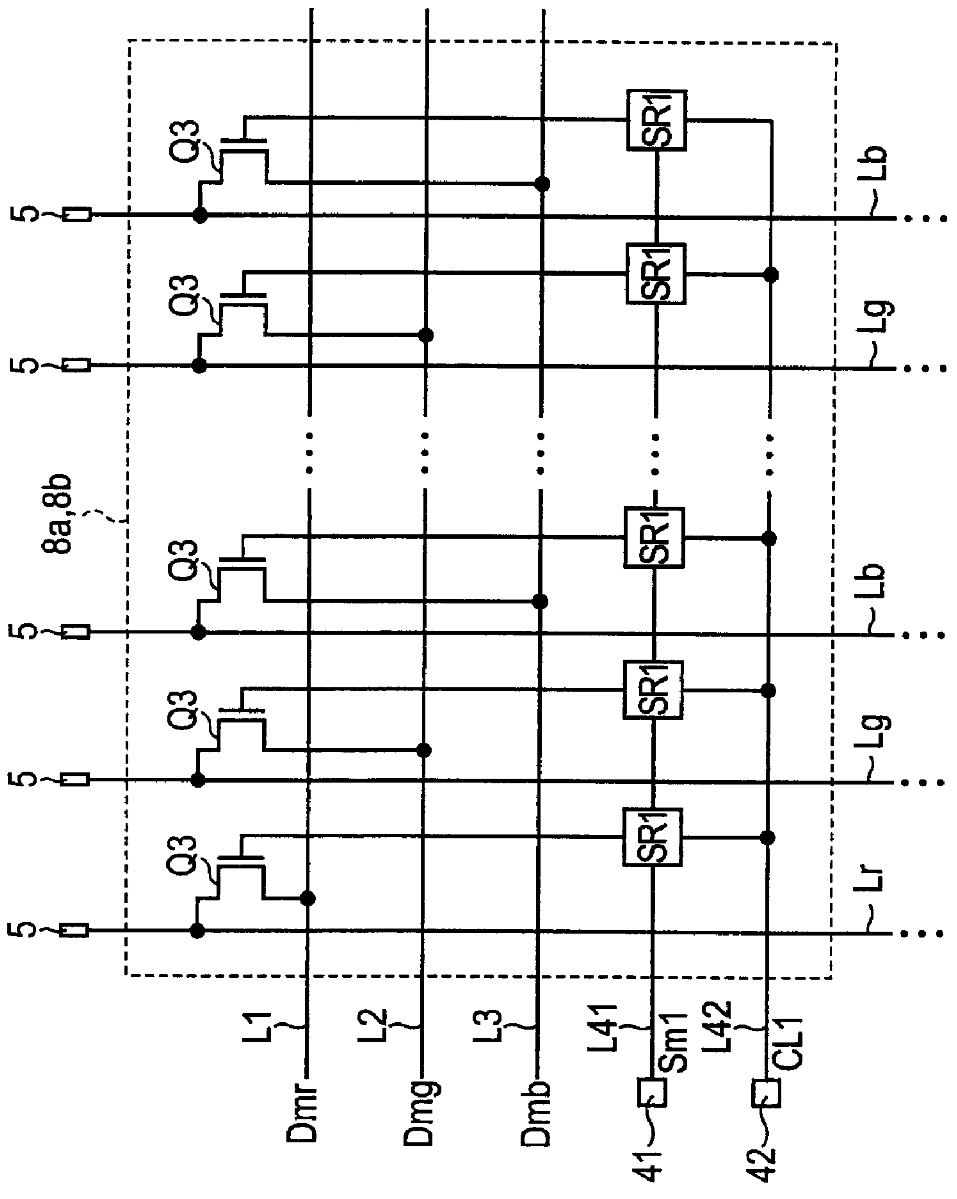
FIG. 6 is an electric circuit diagram illustrating a test circuit part for data line control.

In FIG. 6, the shift register SR1 is provided in the upper and lower test circuit parts for data line control 8_a_, 8_b_ corresponding to each of the data lines Lr, Lg, Lb. The gate of each gate transistor Q3 is connected to the corresponding shift register SR1, respectively.

Each shift register SR1 is serially connected, and the shift register SR corresponding to the most left data line Lr is connected to the selection signal supply line L41. Further, in the most left shift register SR1, the selection signal Sm1 of high level for testing supplied from the selection signal supply line L41 is inputted. Each shift register SR1 is electrically connected to the clock signal supply line L42 formed along row direction, and inputs the clock signal CL1 supplied from the clock signal supply line L42. Moreover, the selection signal supply line L41 and the clock signal supply line L42 are connected to the external terminals for test 41, 42 formed at the corner of the transmissive substrate.

Further, the selection signal Sm1 of high level inputted to the most left shift register SR1 is shift from the left shift register SR to the right shift register SR1 in response to the clock signal CL1. Accordingly, the shift register SR1 from which the selection signal Sm1 of H level is shifted and inputted makes only the corresponding gate transistor Q3 be ON until next clock signal CL1 is generated. Accordingly, one of the data lines Lr, Lg, Lb is selected, the test data signals are supplied to only the selected data line, and thereby the test can be performed.

In the above described embodiment, although the sealing substrate 21, which is a sealing member, is formed with stainless steel (metal), if the receiving concave portion is formed or the sealing member performs an original function, any material may be used.

In the above described embodiment, although the test mode signal external terminal 10 and the test mode signal supply line L0 is commonly provided to the upper and lower test circuit parts for data line control 8_a_, 8_b_ and the left and right test circuit parts for scanning line control 9_a_, 9_b_, they may be independently provided.

In the above described embodiment, although a gate transistor Q4 is provided in the left and right test circuit parts for scanning line control 9_a_, 9_b_, they may be omitted.

In the above described embodiment, although two test circuits of the upper and lower test circuit parts for data line control 8_a_, 8_b_ are provided, only one of them may be provided.

In the above described embodiment, although two test circuits of the left and right test circuit parts for scanning line control 9_a_, 9_b_ are provided, only one of them may be provided.

In the above described embodiment, the upper and lower test circuit parts for data line control 8_a_, 8_b_ supply the test data signals Dmr, Dmg, Dmb from both sides to the common data lines Lr, Lg, Lb, respectively. For example, the upper test circuit parts for data line control 8_a_ may output data signals to odd data line, and the lower test circuit parts for data line control 8_b_ may output data signals to even data line, respectively.

In the above described embodiment, the left and right test circuit parts for scanning line control 9_a_, 9_b_ select the common scanning line Ly from both sides, respectively. For example, the left test circuit parts for scanning line control 9_a_ may select odd scanning line Ly, and the right test circuit parts for scanning line control 9_b_ may select even scanning line Ly, respectively. Further, in the above described embodiment, although the upper and lower test circuit parts for data line control 8_a_, 8_b_ and the left and right test circuit parts for scanning line control 9_a_, 9_b_ are provided, only the upper and lower test circuit parts for data line control 8_a_, 8_b_ may be provided. On the contrary, only the left and right test circuit parts for scanning line control 9_a_, 9_b_ may be provided.

In the above described embodiment, although the external terminals for test are embodied at all corners, they may be embodied at any corner.

In the above described embodiment, although the test circuit is performed by light-emitting each of the organic EL elements 7R, 7G, 7B, the invention is not limited to it, and the invention can apply to the test circuit of the test object such as drive transistor Q1, wiring, or the like.

In the above described embodiment, although the external terminals for test 10, 11, 12, 13, 15, 16, 17, 18, 19, 20 are all input terminals for inputting a signal from the test device, they may be output terminals for outputting a signal to the test device.

In the above described embodiment, although the electro-optical device is embodied with bottom emission type organic EL display 1, top emission type organic EL display can be applied.

The test circuit parts for scanning line control 9_a_, 9_b_ (test circuit parts for data line control 8_a_, 8_b_ are the same as well) may be formed between the region forming the attaching region Z1 and the negative electrode 35 (common electrode of the electro-optical device). Accordingly, each of the test circuit parts 8_a_, 8_b_, 9_a_, 9_b_ and the organic electroluminescent element 7, which is electro-optical element, are protected from moisture or oxygen or the like.

Further, the test circuit parts for scanning line control 9_a_, 9_b_ (test circuit parts for data line control 8_a_, 8_b_ are the same as well) may be formed in the electrode (common electrode of the electro-optical element) to cover the test circuit parts. Accordingly, since an external electromagnetic noise is completely cut off by the sealing substrate 21, each of the test circuit parts 8_a_, 8_b_, 9_a_, 9_b_ can not malfunction by the electromagnetic noise.

In addition, in FIG. 2, although a protective film 36 is formed to cover the electrode 35 (common electrode of the electro-optical element), the protective film 36 may be formed to cover each of the test circuit parts 8_a_, 8_b_, 9_a_, 9_b_. Accordingly, each of the test circuit parts 8_a_, 8_b_, 9_a_, 9_b_, the organic electroluminescent element 7, which is electro-optical element, and the electrode 35 are completely protected from moisture or oxygen or the like, and each of the test circuit parts 8*a*, 8*b*, 9*a*, 9*b* can not be deteriorated by the force applied to the sealing substrate 21 according to any cause. Further, it is preferable that a protective film may be formed to cover the test circuit parts 8*a*, 8*b*, 9*a*, 9*b* and to face the attaching region Z1 with the protective film 36. Accordingly, each of the test circuit parts 8*a*, 8*b*, 9*a*, 9*b*, the organic electroluminescent element 7, which is electro-optical element, and the electrode 35 are completely protected from moisture or oxygen or the like.

In the above described embodiment, although the electro-optical device is embodied to the organic EL display 1, the invention is not limited to the above-mentioned exemplary embodiments. For example, the electro-optical device according to the invention may be a liquid crystal display or the like, an electron-emitter display, or a field-effect display (FED or SED) using the light-emission of a fluorescent material.

Similarly, an organic electroluminescent element, a liquid crystal, and an electron-emitter display may be used as an electro-optical element.

What is claimed is:

1. An electro-optical device, comprising:
a substrate;
a plurality of pixel circuits that are disposed in a display region of the substrate;
a sealing member that seals the plurality of pixel circuits, the sealing member being attached to the substrate in an attaching region of the substrate;
a test circuit, the test circuit including a transistor,
the transistor being electrically connected to a selection signal supply line that supplies a test selection signal, and
the transistor being electrically connected to a test mode signal supply line that supplies a test mode signal;
an external terminal that is coupled to the test circuit;
a shift register that is electrically connected to the selection signal supply line; and
a clock signal supply line that is electrically connected to the shift register and supplying a clock signal for testing,
each of the plurality of pixel circuits including an anode, a functional layer having a light-emitting layer, and a cathode,
the test circuit being arranged between the display region and the attaching region, and
the external terminal being arranged outside of the attaching region.

2. The electro-optical device of claim 1, further comprising:
each of the plurality of pixel circuits being electrically connected to a scanning line and a data line;
a selection signal input terminal that is electrically connected to the scanning line; and
a data signal input terminal that is electrically connected to the data line,
the selection signal input terminal being arranged on a first side of the substrate,
the data signal input terminal being arranged on a second side different from the first side of the substrate, and
the external terminal for testing being formed at a corner at which the first side of the substrate crosses the second side.

3. The electro-optical device of claim 1,
the external terminal for testing being used as an alignment mark.

4. The electro-optical device of claim 1,
wherein the transistor being electrically connected to a test data signal supply line that supplies a test data signal.

5. The electro-optical device of claim 4, further comprising:
an external terminal for testing that is electrically connected to the test mode signal supply line; and
an external terminal for testing that is electrically connected to the test data signal supply line.

6. The electro-optical device of claim 4,
the plurality of pixel circuits including a pixel circuit having an electro-optical element that emits a red light, a pixel circuit having an electro-optical element that emits a green light, and a pixel circuit having an electro-optical element that emits a blue light; and
the test data signal supply line including
a red test data signal supply line connected to the electro-optical element that emits red light;
a green test data signal supply line connected to the electro-optical element that emits green light; and
a blue test data signal supply line connected to the electro-optical element that emits blue light.

7. The electro-optical device of claim 1, further comprising:
an external terminal for testing that is electrically connected to the selection signal supply line;
an external terminal for testing that is electrically connected to the clock Signal supply line; and
an external terminal for testing that is electrically connected to the test mode signal supply line.

* * * * *